United States Patent [19]
Huang et al.

[11] Patent Number: 5,970,364
[45] Date of Patent: Oct. 19, 1999

[54] METHOD OF NITRIDE-SEALED OXIDE-BUFFERED LOCAL OXIDATION OF SILICON

[75] Inventors: Hsiu-Wen Huang, Kaohsiung; Gary Hong, Hsinchu, both of Taiwan

[73] Assignee: United Semiconductor Circuit Corp., Hsinchu, Taiwan

[21] Appl. No.: 09/048,697

[22] Filed: Mar. 26, 1998

[51] Int. Cl.⁶ .................................................. H01L 21/762
[52] U.S. Cl. ........................... 438/445; 438/452; 438/439
[58] Field of Search ..................................... 438/445, 452, 438/439, FOR 229, FOR 230

[56] References Cited

U.S. PATENT DOCUMENTS 4,563,227  1/1986  Sakai et al. .

OTHER PUBLICATIONS

Teng, C., et al., "Optimization of Sidewall Masked Isolation Process", IEEE Journal of Solid-State Circuits, vol. Sc-20, No. 1, pp. 44–51 Feb. 1985.

*Primary Examiner*—George Fourson
*Attorney, Agent, or Firm*—Merchant & Gould, P.C.

[57] ABSTRACT

A method for forming an isolation region in an integrated circuit is disclosed. The method includes forming a pad layer on a semiconductor substrate, and forming an oxidation masking layer on the pad layer, wherein the pad layer relieves stress from the oxidation masking layer. Next, portions of the oxidation masking layer and the pad layer are patterned and etched. A first oxide layer is thermally grown on the substrate, and a second oxide spacer is formed on a sidewall of the pad layer and the oxidation masking layer. After forming a nitride spacer on a surface of the second oxide spacer, the substrate is thermally oxidized to form the isolation region in the substrate.

12 Claims, 3 Drawing Sheets

METHOD OF NITRIDE-SEALED OXIDE-BUFFERED LOCAL OXIDATION OF SILICON

BACKGROUND OF THE INVENTION

1. Field of the Invention

The present invention relates to a method for forming isolation regions, and more particularly, to a method of nitride-sealed oxide-buffered local oxidation of silicon (NO-LOCOS).

2. Description of the Prior Art

The art of isolating semiconductor devices becomes one important aspect of modem metal-oxide-semiconductor (MOS) and bipolar integrated circuit technology. With increasing densities of up to hundreds of thousands of devices on a single chip, improper isolation among devices will cause current leakages. These current leakages can consume significant amounts of power. In addition, improper isolation between devices can exacerbate latchup, which can damage the circuit temporarily or permanently. Still further, improper isolation can result in noise margin degradation, voltage shift or crosstalk.

In MOS technology, isolation is usually practiced by forming isolation regions between neighboring active regions. Typically, an isolation region is formed by ion-implanting a channel stop layer of polarity opposite to the source electrode and the drain electrode of the integrated circuit device, and growing a thick oxide, often referred to as field oxide (FOX). The channel stop and the FOX cause the threshold voltage in the isolation region to be much higher than those of the neighboring active devices, making surface inversion not likely to occur under the field oxide region.

The local oxidation of silicon (LOCOS) method is widely used to isolate active regions in silicon. In LOCOS technology, a silicon nitride layer is used as an efficient oxidation mask which prevents the oxidants from reaching the silicon surface covered by silicon nitride. In addition, the silicon nitride layer oxidizes very slowly compared to silicon. However, direct deposition of silicon nitride on silicon can cause stress induced defects when the structure is subjected to oxidation at elevated temperature. These defects can be considerably reduced by forming a thin (100–500 angstroms) pad oxide layer between the silicon and the silicon nitride. The pad oxide reduces the force transmitted to the silicon by relieving the stress. It thus acts as a buffer which cushions the transmission of stress between the silicon and the silicon nitride.

Unfortunately, the pad oxide layer provides a lateral path for oxidation of silicon. This lateral extension of oxidation through pad oxide is frequently referred to as a "bird's beak" because of its form. The extent of the bird's beak can be reduced by decreasing the thickness of the pad oxide, which, however will cause more stress induced defects from the above silicon nitride layer. Therefore, the thickness of the pad oxide and the silicon nitride layer must be optimized to minimize the extent of the bird's beak without generating defects.

Several methods in the prior art have been designed for improving the LOCOS isolation process to minimize the bird's beak. For example, the sealed-interface local oxidation (SILO) process uses an additional thin silicon nitride over the silicon substrate followed by forming a pad oxide layer and then a thick silicon nitride layer. The SILO process can reduce the bird's beak, but at the expense of generating more stress, more crystal defects, and higher leakage currents.

Another improved LOCOS method, called buried oxide (BOX) process, has been devised which uses an aluminum mask to etch a silicon groove and then subsequently remove a plasma deposited silicon dioxide layer. The BOX process can effectively reduce the bird's beak, but at the expense of manufacture complexity.

FIG. 1A shows a schematic cross-section of a conventional poly-spacer LOCOS (PS-LOCOS) structure, wherein polysilicon spacers 12 are formed on the sidewalls of a substrate 10, a pad oxide 16 and a silicon nitride layer 14. This structure is then subject to a thermal oxidation, thereby forming field oxide regions 18 as shown in FIG. 1B. After the polysilicon spacer 12, the pad oxide 16 and the silicon nitride layer 14 are removed, an non-planar topography is disadvantageously generated near the edge of the field oxide regions 18.

FIG. 2 further shows a schematic cross-section of a conventional nitride-spacer LOCOS (NS-LOCOS) structure, wherein nitride spacers 22 are formed on the sidewalls of a substrate 20, a pad oxide 26 and a silicon nitride layer 24. The disadvantage of this structure is its stress-induced defects near the edge of the grown field oxide regions (not shown).

SUMMARY OF THE INVENTION

In accordance with the present invention, a method is provided for forming an isolation region with good topography near the edge of the isolation region in an integrated circuit that substantially reduces the bird's beak, and minimizes stress-induced defects. In one embodiment, a pad oxide layer is formed on a semiconductor substrate, and a first silicon nitride layer is formed on the pad oxide layer, wherein the pad oxide layer relieves stress from the first silicon nitride layer. The first silicon nitride layer and the pad oxide layer are then patterned and etched, therefore exposing a portion of the substrate. Next, a portion of the pad oxide layer is laterally removed to form at least one undercut under the first silicon nitride layer. A first oxide layer is thermally growing on the substrate, and a second oxide spacer is formed on a sidewall of the pad oxide layer and the first silicon nitride layer. Thereafter, a second silicon nitride spacer is formed on a surface of the second oxide spacer, and the substrate is thermally oxidized to form the isolation region in the substrate. Finally, the first silicon nitride layer, the pad oxide layer, the second oxide spacer, the second silicon nitride spacer, and the first oxide layer are removed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
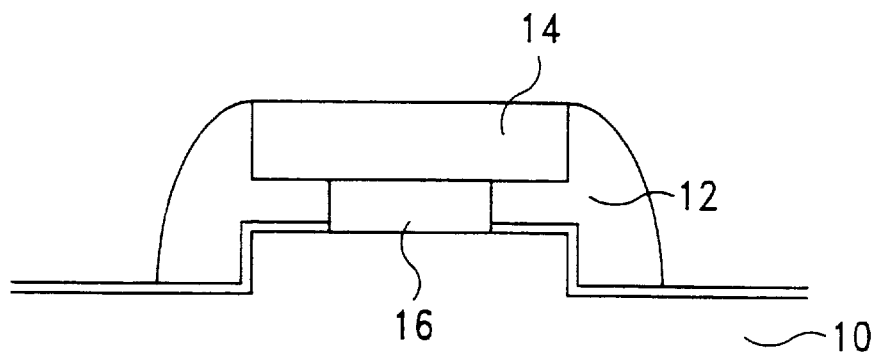
FIG. 1A shows a schematic cross-section of a conventional poly-spacer LOCOS (PS-LOCOS) structure.
Figure 1B:
FIG. 1B shows a schematic cross-section of thermally grown field oxide regions.
Figure 2:
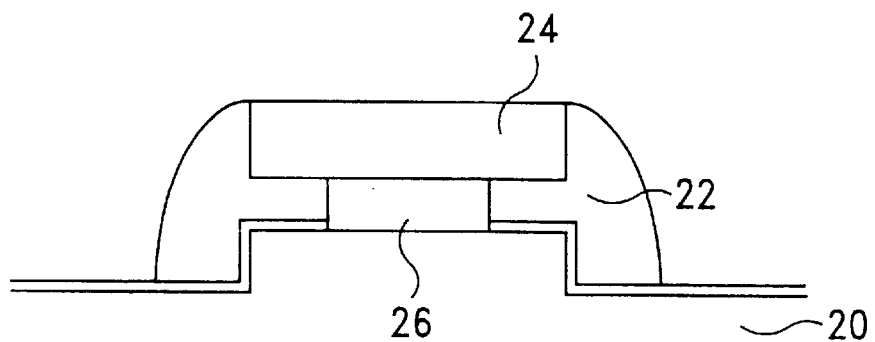
FIG. 2 shows a schematic cross-section of a conventional nitride-spacer LOCOS (NS-LOCOS) structure.
Figure 3A:
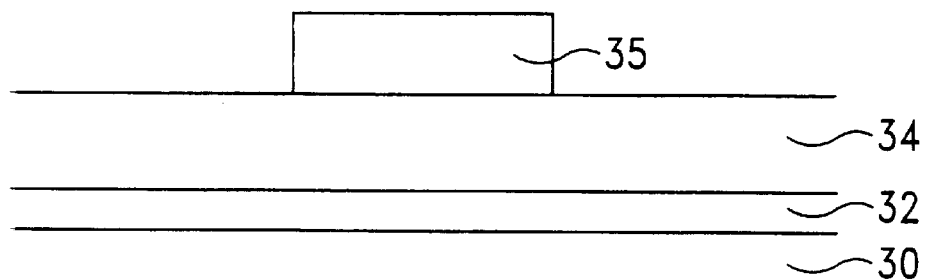
FIGS. 3A to 3E show cross-sectional views illustrative of various stages in the fabrication of a nitride-sealed oxide-buffered LOCOS structure in accordance with the present invention.

FIG. 3A shows a schematic cross-section of a semiconductor substrate 30. A silicon oxide layer 32 is grown, for example, at about 1000° C. in a conventional furnace. In this embodiment, the thickness of the silicon oxide layer 32 is preferably in the range of about 50–350 angstroms. Then, a silicon nitride layer 34 is deposited, for example, using a low pressure chemical vapor deposition (LPCVD) process. The silicon nitride layer 34 has a thickness of about 1000–3000 angstroms. The silicon oxide layer 32 is frequently referred to as a pad oxide in isolation technology and is used to reduce the force transmitted from the silicon nitride layer 34 to the substrate 30. The silicon nitride layer 34 is, however, used as an oxidation mask which prevents the oxidants from reaching the substrate 30 under the silicon nitride layer 34 in a later oxidation step. Thereafter, a photoresist masking layer 35 having an active region pattern is formed over the silicon nitride layer 34. This pattern is defined using standard photoresist coating, exposure and development processes.

Figure 3B:
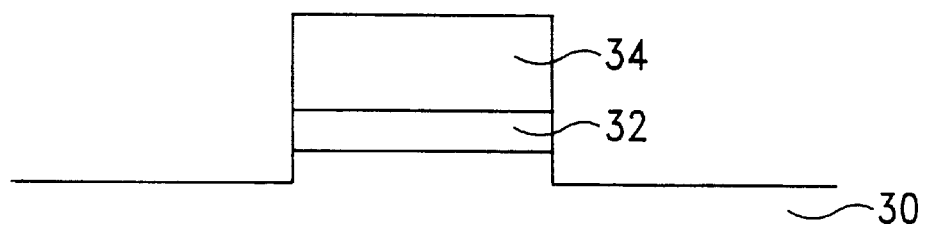

Next, the silicon nitride layer 34 and the pad oxide layer 32 are etched using the photoresist layer 35 as a mask. FIG. 3B shows the structure after anisotropically etching the silicon nitride layer 34 and the pad oxide 32. It is noted that a small portion of the substrate 30 is generally recessed after having etched the silicon nitride layer 34 and the pad oxide layer 32.

Figure 3C:
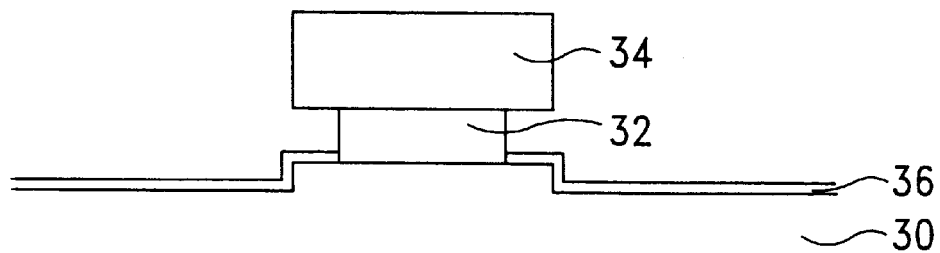

Referring to FIG. 3C, a portion of the pad oxide layer 32 is isotropically etched to form a lateral undercut under the silicon nitride layer 34. The lateral width of the undercut is preferably between 100 and 300 angstroms. Typically, a wet etchant such as diluted hydrofluoric (HF) solution is used because it has the advantage of dissolving silicon dioxide without attacking silicon and silicon nitride. Practically, the HF is mixed with ammonium fluoride ($NH_4F$), known as a buffered oxide etch (BOE), to slow down the etch rate into a more controllable process. This etch step is primarily utilized to reduce bird's beak during later oxidation process. Thereafter, a thin oxide layer 36 is thermally grown on the surface of the substrate 30. In this embodiment, the thickness of the thin oxide layer 36 is preferably in the range of about 30–50 angstroms.

Figure 3D:
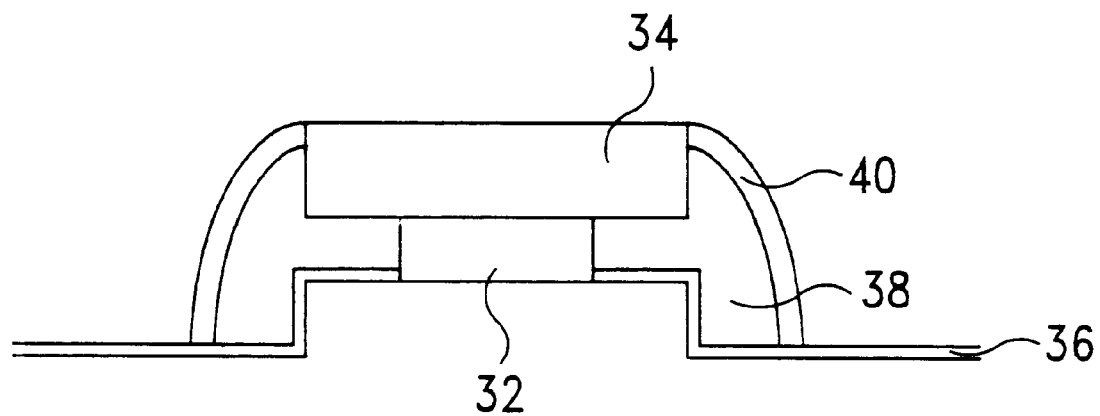

Next, oxide spacers 38 are formed on the sidewalls of the silicon nitride layer 34 and the pad oxide layer 32 as shown in FIG. 3D. The oxide spacers 38 are preferably formed by firstly blanket depositing an oxide layer 38 over the silicon nitride layer 34 and the substrate 30, followed by etching back this oxide layer 38. In this embodiment, the material of the oxide spacers 38 is preferably phosphosilicate glass (PSG) deposited, for example by plasma-enhanced chemical vapor deposition (PECVD) or silicon-rich oxide (SRO) such as $Si_{1+x}O_2$ deposited, for example by plasma-enhanced chemical vapor deposition (PECVD). It is appreciated that other material, such as boro-phosphosilicate glass (BPSG), can be adequately used in the present invention.

Thereafter, thin nitride spacers 40 are formed on the surfaces of the oxide spacers 38 as shown in FIG. 3D. The nitride spacers 40 are preferably formed by firstly blanket depositing a silicon nitride layer 40 over the silicon nitride layer 34, the oxide spacers 38 and the substrate 30, followed by etching back the silicon nitride layer 40.

Figure 3E:
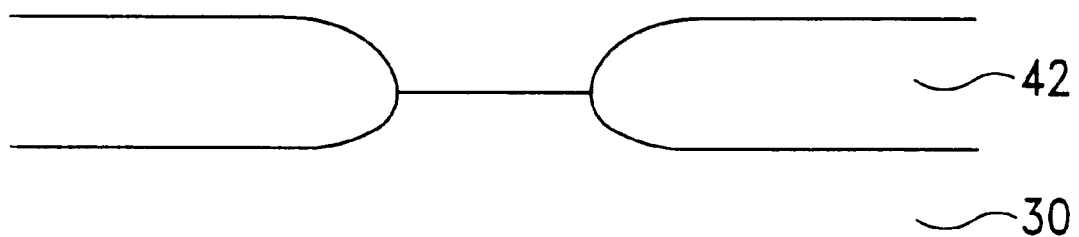

The structure of FIG. 3D is then subjected to thermal oxidation or steam oxidation to thermally grow thick field oxides 42 on and in the substrate 30 as shown in FIG. 3E, wherein the nitride spacers 40 are used to reduce the bird's beak. In this embodiment, the thickness of this field oxide 42 is about 3000–10000 angstroms, and the temperature of oxidation is about 1100° C.

To complete the present invention, the silicon nitride layer 34, the pad oxide layer 32, the thin nitride spacers 40, the oxide spacers 38, and the thin oxide layer 36 are removed using a suitable etch method. Because the etching rate of oxide spacers 38 is larger than that of the thermally grown thin oxide layer 36, for example, under diluted hydrofluoric (HF) solution, loss of the field oxide 42 is reduced. A smooth topography is therefore obtained near the edge of the field oxide regions 42.

Although specific embodiments have been illustrated and described, it will be obvious to those skilled in the art that various modifications may be made without departing from the spirit which is intended to be limited solely by the appended claims.

What is claimed is:

1. A method for forming an isolation region, said method comprising:

forming a pad layer on a semiconductor substrate;

forming an oxidation masking layer on said pad layer, said pad layer relieving stress from said oxidation masking layer;

patterning to etch said oxidation masking layer and said pad layer, therefore exposing a portion of the substrate;

thermally growing a first oxide layer on said substrate;

forming a second oxide spacer on a sidewall of said pad layer and said oxidation masking layer;

forming a nitride spacer on a surface of said second oxide spacer; and thermally oxidizing the substrate to form the isolation region in the substrate.

2. The method according to claim 1, further comprising laterally removing said pad layer to form at least one undercut under said oxidation masking layer.

3. The method according to claim 1, before thermally growing the first oxide layer on said substrate, further comprising recessing the substrate.

4. The method according to claim 1, wherein said forming the second oxide spacer comprises:

depositing a second oxide layer over said oxidation masking layer and said substrate; and etching back said second oxide layer to form said second oxide spacer.

5. The method according to claim 1, wherein said second oxide spacer comprises a material chosen from the group consisting of phosphosilicate glass, silicon-rich oxide, and boro-phosphosilicate glass.

6. The method according to claim 1, further comprising removing said oxidation masking layer, said pad layer, said second oxide spacer, said nitride spacer, and said first oxide layer.

7. The method according to claim 1, wherein said oxidation masking layer comprises silicon nitride.

8. The method according to claim 1, wherein said pad layer comprises silicon oxide.

9. A method for forming an isolation region, said method comprising:

forming a pad oxide layer on a semiconductor substrate;

forming a first silicon nitride layer on said pad oxide layer, said pad oxide layer relieving stress from said first silicon nitride layer;

patterning to etch said first silicon nitride layer and said pad oxide layer, therefore exposing a portion of the substrate;

laterally removing a portion of said pad oxide layer to form at least one undercut under said first silicon nitride layer;

thermally growing a first oxide layer on said substrate;

forming a second oxide spacer on a sidewall of said pad oxide layer and said first silicon nitride layer;

forming a second silicon nitride spacer on a surface of said second oxide spacer;

thermally oxidizing the substrate to form the isolation region in the substrate; and removing said first silicon nitride layer, said pad oxide layer, said second oxide spacer, said second silicon nitride spacer, and said first oxide layer.

10. The method according to claim 9, before thermally growing the first oxide layer on said substrate, further comprising recessing the substrate.

11. The method according to claim 9, wherein said forming the second oxide spacer comprises:

depositing a second oxide layer over said first silicon nitride layer and said substrate; and etching back said second oxide layer to form said second oxide spacer.

12. The method according to claim 9, wherein said second oxide spacer comprises a material chosen from the group consisting of phosphosilicate glass, silicon-rich oxide, and boro-phosphosilicate glass.

* * * * *